(12) United States Patent
Schindler

(10) Patent No.: US 6,199,064 B1
(45) Date of Patent: Mar. 6, 2001

(54) METHOD AND APPARATUS FOR SORTING DATA BLOCKS

(76) Inventor: Michael Schindler, Billrothstrasse 39/2/21, A-1190 Wien (AT)

( * ) Notice: Under 35 U.S.C. 154(b), the term of this patent shall be extended for 0 days.

(21) Appl. No.: 08/970,220

(22) Filed: Nov. 14, 1997

(30) Foreign Application Priority Data

Nov. 15, 1996 (AT) .............................. AT 2001/96

(51) Int. Cl.[7] .............................. G06F 7/00; G06F 17/30
(52) U.S. Cl. .............................. 707/7; 707/100; 707/101
(58) Field of Search .............................. 707/7, 101, 100; 341/107, 51

(56) References Cited

U.S. PATENT DOCUMENTS

| | | | |
|---|---|---|---|
| 3,611,316 | * | 10/1971 | Woodrun ................................... 707/7 |
| 4,862,167 | * | 8/1989 | Copeland, III ....................... 341/107 |
| 5,150,430 | * | 9/1992 | Chu ......................................... 382/56 |
| 5,153,591 | * | 10/1992 | Clark ....................................... 341/51 |
| 5,274,805 | * | 12/1993 | Ferguson et al. .......................... 707/7 |
| 5,394,143 | * | 2/1995 | Murray et al. .......................... 341/63 |
| 5,396,622 | * | 3/1995 | Lee et al. ................................. 707/7 |
| 5,490,269 | * | 2/1996 | Cohn et al. .............................. 707/7 |
| 5,530,854 | * | 6/1996 | Emery et al. ........................ 707/100 |
| 5,551,018 | * | 8/1996 | Hansen ..................................... 707/7 |
| 5,842,208 | * | 11/1998 | Blank et al. ............................. 707/7 |
| 6,075,470 | * | 6/2000 | Little et al. .......................... 341/107 |

OTHER PUBLICATIONS

Fenwick, P., "Block Sorting Text Compression—Final Report," Technical Report 130, ISSN 1173–3500, Apr. 23, 1996.

Burrows, M., et al., "A Block–Sorting Lossless Data Compression Algorithm," SRC Search Report, pp. 1–18, XP646918, (1994).

Yokoo, H., et al., "Data Compression by Context Sorting," IEICE Transactions on Fundamentals of Electronics, E79–A(5):681–686 (1996).

Wongsawang, D., et al., "Dependency Data Compression with Self–Organizing Lists," Transactions of Information Processing in Japan, 35(6):955–965 (1994).

* cited by examiner

Primary Examiner—Jean R. Homere
(74) Attorney, Agent, or Firm—Hamilton, Brook, Smith & Reynolds, P.C.

(57) ABSTRACT

A method of sorting a block of data is provided which includes ordering a plurality of data values into a source data block. A non-unique sort order, based on a limited number of comparisons of the data values in the source data block, is established and, after the comparisons, a unique sort order of the data values based on position of the data values in the source data block is established. The method further includes restoring the source data block from the unique sort order. An apparatus for sorting a block of data is also provided, the apparatus including, inter alia, a first mechanism for calculating a non-unique sort order based on a limited number of equal comparisons of the data values in the source data block and a second mechanism for establishing, after the comparisons, a unique sort order of the data values based on position of the data values in the source data block. The apparatus further includes a third mechanism for restoring the source data block from the established sort order.

24 Claims, 15 Drawing Sheets

FIG. 4A

| ORIGINAL SOURCE LETTERS 105 | a | b | r | a | c | a | d | a | b | r | a |
|---|---|---|---|---|---|---|---|---|---|---|---|
| PREVIOUS LETTERS 107 | ra | aa | ab | br | ra | ac | ca | ad | da | ab | br |
| TEXT POSITION 109 | 1 | 2 | 3 | 4 | 5 | 6 | 7 | 8 | 9 | 10 | 11 |

FIG. 4B

| SORTED LETTERS 112 | b | d | b | a | c | a | r | r | a | a | a |
|---|---|---|---|---|---|---|---|---|---|---|---|
| 107' | aa | ca | da | ra | ra | ac | ab | ab | ad | br | br |
| 109' | 2 | 7 | 9 | 1 | 5 | 6 | 3 | 10 | 8 | 4 | 11 |

FIG. 5A

| DECODED TEXT 112' | b | d | b | a | c | r | r | a | a | a | a |
|---|---|---|---|---|---|---|---|---|---|---|---|
| PROCESSER SORT 151 | a | a | a | a | b | b | b | c | d | r | r |
| PAIRS 152 | ab | ad | ab | aa | ac | br | br | ca | da | ra | ra |
| SORT ORDER 153 | aa | ca | da | ra | ra | ab | ab | ac | ad | br | br |
| INDEX 154 | 1 | 2 | 3 | 4 | 5 | 6 | 7 | 8 | 9 | 10 | 11 |

FIG. 5B

| INDEX 154 | 11 | 4 | 1 | 6 | 10 | 5 | 8 | 2 | 9 | 3 | 7 |
|---|---|---|---|---|---|---|---|---|---|---|---|
| 105' | bra | a | b | r | a | c | a | d | a | b | r |

```
                                              PIXELS    PIXELS
                                               300       300
A  e  c  e  A  e  c  e  A  e  c  e  A  e  c  e  A
e  d  e  d  e  d  e  d  e  d  e  d  e  d  e  d  e
c  e  b  e  c  e  b  e  c  e  b  e  c  e  b  e  c
e  d  e  d  e  d  e  d  e  d  e  d  e  d  e  d  e
A  e  c  e  A  e  c  e  A  e  c  e  A  e  c  e  A
e  d  e  d  e  d  e  d  e  d  e  d  e  d  e  d  e
c  e  b  e  c  e  b  e  c  e  b  e  c  e  b  e  c
e  d  e  d  e  d  e  d  e  d  e  d  e  d  e  d  e
A  e  c  e  A  e  c  e  A  e  c  e  A  e  c  e  A
e  d  e  d  e  d  e  d  e  d  e  d  e  d  e  d  e
c  e  b  e  c  e  b  e  c  e  b  e  c  e  b  e  c
e  d  e  d  e  d  e  d  e  d  e  d  e  d  e  d  e
A  e  c  e  A  e  c  e  A  e  c  e  A  e  c  e  A
```

315 points to the A in row 1, column 9.

A 3×3 box is drawn around:
```
c e A
e d e
b e c
```

FIG. 8D

METHOD AND APPARATUS FOR SORTING DATA BLOCKS

RELATED APPLICATIONS

This application is a Continuation-in-Part which claims priority to Austrian patent application serial number AT 2001/96, entitled "Sortierverfahren und System zur Datenkompression" and filed on Nov. 15, 1996 by Dipl-Ing. Michael Schindler and to a PCT application entitled "Computer Sorting System for Data Compression" and filed on Nov. 14, 1997 by Dipl-Ing. Michael Schindler, the teachings of which are both incorporated herein by reference in their entirety.

BACKGROUND

Data compression is state of the art in permanent data storage (e.g. fixed disk, tape, diskette) as well as in data transfer (e.g. using a modem). There are well known methods for this, implemented either in software (e.g. as part of an operating system) or in hardware (e.g. chips in magnetic tape and data transfer devices). Although data can be sequentially compressed as a data stream, the better data compression methods require searching or sorting which complicates implementation in hardware and which makes the processing time indeterminate in software.

One example of a sorting method is the Burrows-Wheeler Transform (BWT) which processes a block of data as a single unit. A reversible transformation is applied to a block of text to form a new block having the same characters. This transformation tends to group like characters together so as to improve the probability of finding a character close to another instance of the same character. This sorted text can then be compressed with locally-adaptive algorithms, such as move-to-front coding in combination with Huffman or arithmetic coding.

SUMMARY OF THE INVENTION

A goal of preferred embodiments of the invention is to make a computer sorting system that is very simple, fast, deterministic in time and well suited for hardware implementation. The slow sorting of a data block and the recommended run-length encoding of the prior art is replaced by a new method. The output of this method is then compressed by any state of the art encoding method suitable for this task.

In case of equality after a predetermined number of steps, the position of the data within the data block is used as sort key instead of further comparisons. This position will always be different for different data items and will therefore always lead to a unique result. By using the position as the secondary sort key, only a predetermined limited number of characters is used for sorting (limited context). A context size of 4–6 characters is sufficient for most cases.

The main advantage is not this early exit but that in most cases, where the number of compared symbols is not much larger than the base two logarithm of the size of the to be sorted data block, a radix sorting algorithm, originally developed for mechanical sorting, can be used. This sorting method has all characteristics demanded in the original problem description: its hardware implementation is simple and its processing time is fast and fixed. A second advantage is that if radix sort is used, the throughput is not influenced by the block size. This allows the use of large data blocks, which improves compression. Depending on the circumstances, a bucket sort or a variant of a multikey quicksort may be better suited for the sorting task.

Another advantage of limited context is that anything can be used as context, for example the corresponding field of the last similar dataset. This allows improves compression for many applications.

The sorting described above can be reversed, which is essential for decompression. For reversal the starting points for each sort key (context) have to be known. In the case of internal contexts example one shows a way to count all contexts and thus calculate starting points for each. Furthermore, a modification of prior art methods can be used to count contexts. In case of external contexts all context information is known at the decoder.

Contrary to prior art sorts which establishes a unique order by continuing comparisons, a unique order in accordance with preferred embodiments of the invention is established in doubt by considering the original position.

The above and other features of the invention, including various novel details of construction and combination of parts, will now be more particularly described with reference to the accompanying drawings and pointed out in the claims. It will be understood that the particular Computer Sorting System for Data Compression embodying the invention is shown by way of illustration only and not as a limitation of the invention. The principles and features of this invention may be embodied in varied and numerous embodiments without departing from the scope of the invention.

BRIEF DESCRIPTION OF THE DRAWINGS

FIGS. 4A–4B illustrates a method of sorting for compression using internal contexts.

FIGS. 5A–5B illustrate a method of unsorting the sorted text of FIG. 4B for decompression using internal contexts.

FIGS. 8A–8D illustrate a method used in situations where the contexts for each data item to be coded are supplied as input data known to both the encoder and decoder.

DETAILED DESCRIPTION OF PREFERRED EMBODIMENTS OF THE INVENTION

Figure 1:
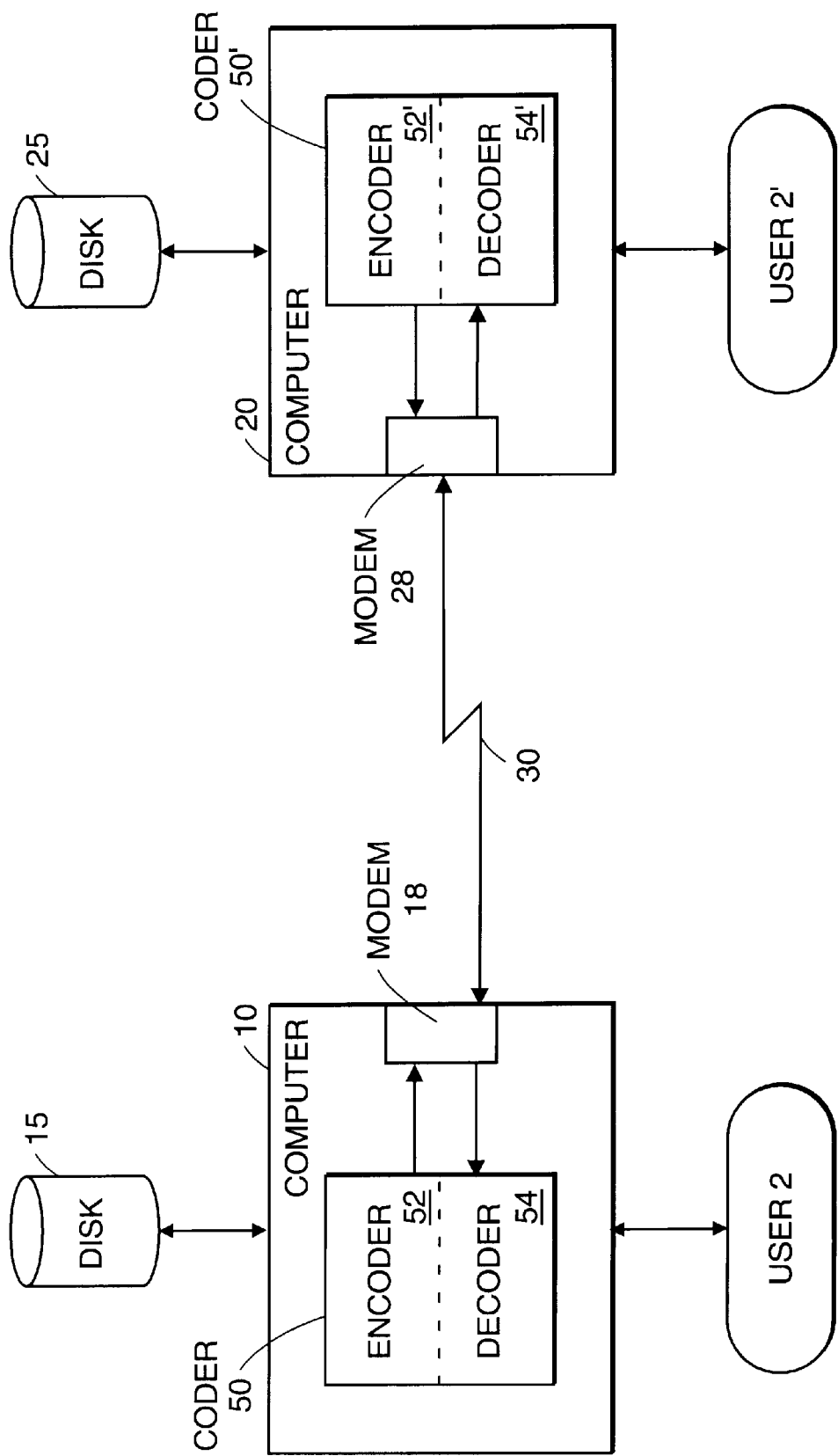
FIG. 1 is a schematic block diagram of a computing system in accordance with a preferred embodiment of the invention.

FIG. 1 is a schematic block diagram of a computing system in accordance with a preferred embodiment of the invention. Illustrated are two computers 10, 20 communicating over a communication link 30 via respective modems 18, 28. Each computer 10, 20 is operated by a respective user 2, 2'. Data is stored on respective disks 15, 25.

In accordance with a preferred embodiment of the invention, each computer 10, 20 executes a respective data coder 50, 50'. Each data coder 50, 50' includes a respective encoder 52, 52' for compressing data and a respective decoder 54, 54' for decompressing data. The data coder 50, 50' communicates with the modem 18, 28 to encode data for transmission over the communication link 30 and to decode received data from the communication link 30. The data coder 50, 50' can also encode data for storage on the disk 15, 25 and decode the stored data read from the disk 15, 25.

In a preferred embodiment of the invention, the coder 50 is incorporated within a computing system having one or more computing devices. The coder 50 can be an executable software program or a hardware module. In either case, the coder 50 is embodied in a machine-readable medium, such as magnetic or optical storage or directly fabricated into a circuit device. A computer program embodying preferred embodiments of the invention is preferably distributed on a magnetic storage medium (e.g. hard disk, floppy disk, or tape) or on an optical storage medium (e.g. CD-ROM). It will also be understood that a computer can be specialized machines. For example, compressed data can be stored on a machine-readable medium and decompressed by a dedicated decompressor for use by any machine, such as a typesetting machine.

In particular, preferred embodiments of the invention include a method for sorting data which brings together data items which occur in a similar environment (the "context"). This reordering ("transformation") of the data block allows it to be compressed more effectively using known compression algorithms. The contexts can be "internal", meaning that they can be established by the other bytes in the data block being encoded. The contexts can also be "external", meaning that they can be provided as data known to both the encoder 52 and the decoder 54.

Figure 2:
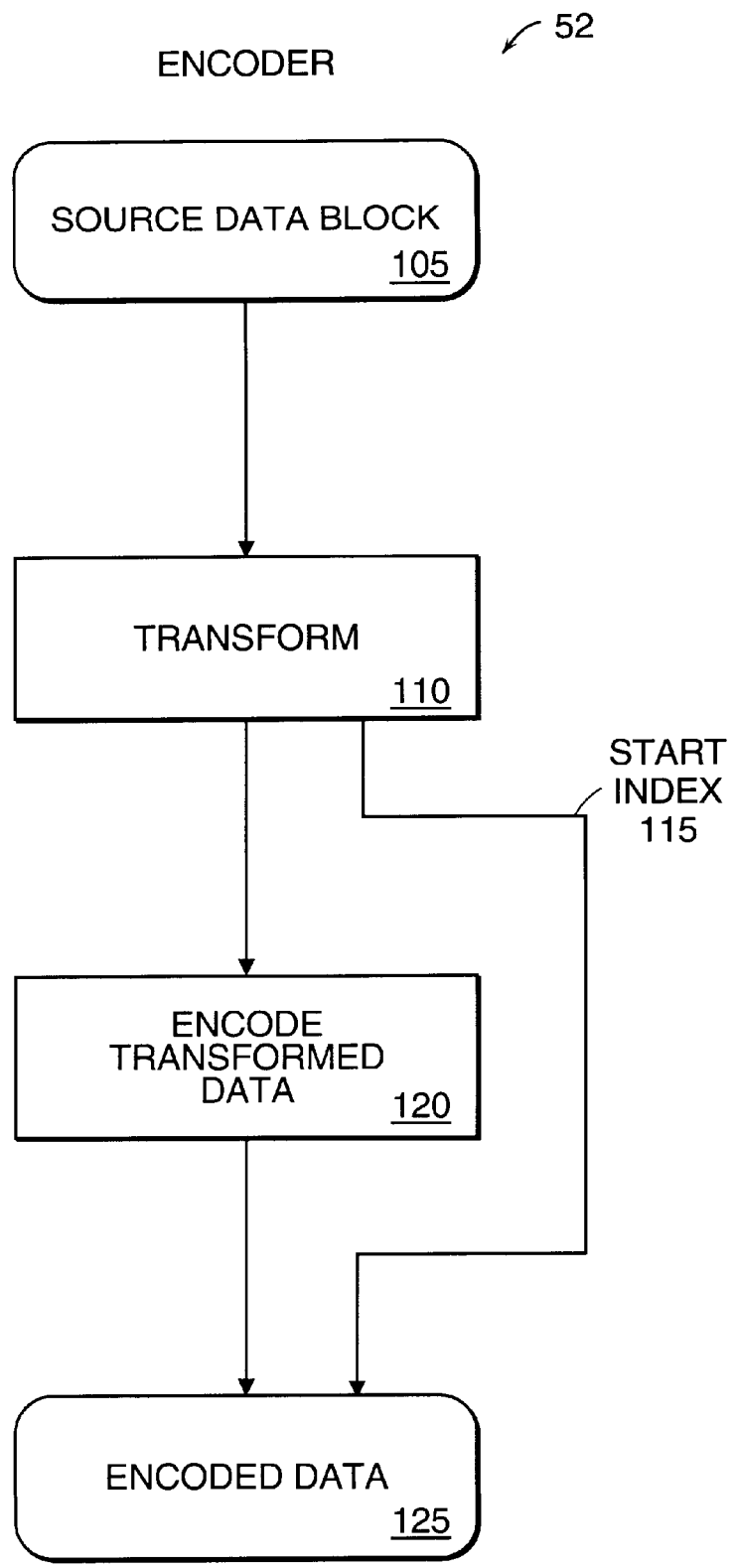
FIG. 2 is a block diagram of an encoder using internal contexts in accordance with a preferred embodiment of the invention.

FIG. 2 is a block diagram of an encoder 52 using internal contexts in accordance with a preferred embodiment of the invention. A source data block 105 is processed by a transform function 110, using either the prior art Burrows-Wheeler Transform (BWT) or a transform as described below. A start index 115 which is needed to reverse the transform is stored. The transformed data is then compressed by an compression transform data function 120 using any suitable compression method. Two or more stage arithmetic coding using a cache and two special symbols for binary representation of a repetition count have been useful. The encoded data 125 includes the compressed transform data and the start index 115.

Figure 3:
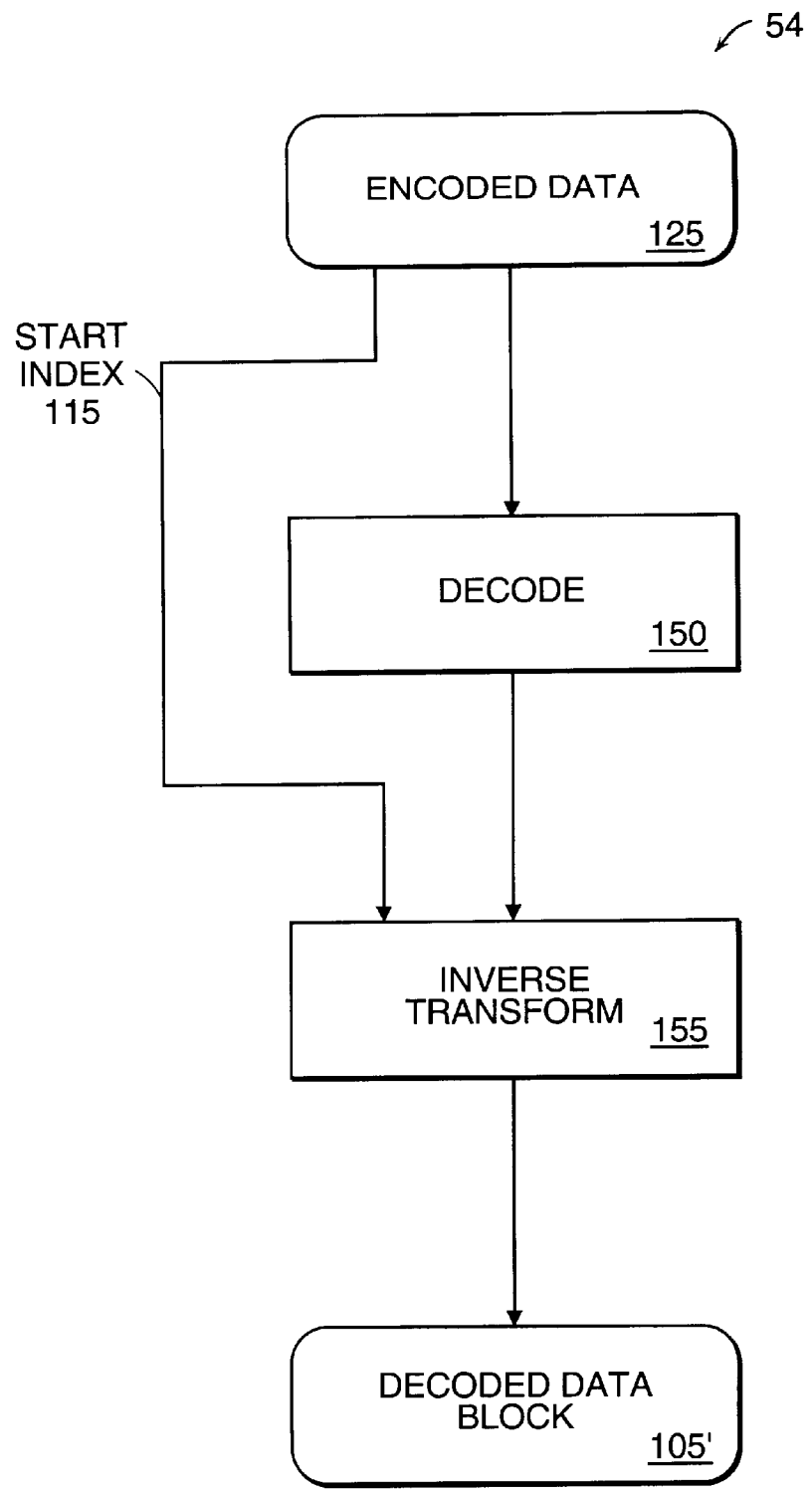
FIG. 3 is a block diagram of a decoder using internal contexts in accordance with a preferred embodiment of the invention.

FIG. 3 is a block diagram of a decoder 54 using internal contexts in accordance with a preferred embodiment of the invention. To restore the original data block 105, the compression algorithm 120 (FIG. 2) is reversed. The start index 115 is separated from the encoded data 125. The remaining data is then decompressed by a decompressor 150. The resulting decoded data and the start index 115 are then processed by an inverse transform function 155, which completes the decoding and yields a decoded data block 105' identical to the original data block 105.

The difference between preferred embodiments of the invention and the BWT is the transform 110 (FIG. 2) and the inverse transform 155 (FIG. 3). The transform in accordance with the present invention and the differences from BWT are more fully described in the following example.

FIGS. 4A–4B illustrates a method of sorting for compression using internal contexts. As illustrated in FIG. 4A, the example uses order 2, text 'abracadabra', alphabet {'a','b','c','d','r'}. The source data block 105 is therefore the ordered letters:

a b r a c a d a b r a

From each letter in the source data block 105, the previous two letters 107 are determined to be:

ra aa ab br ra ac ca ad da ab br Each letter in the source data block 105 is also associated with a respective text position or index 109 in the source data block 105. Because there are eleven letters, there are eleven text positions 107 (1–11), as illustrated.

The letters are then sorted by the previous letters as illustrated in FIG. 4B. The sort looks first at the immediately preceding letter, and if they are equal, it compares the next previous letter. If two letters have the same context, they are listed in the order that they occur in the original data block.

The resulting sorted letters 112 are:

b d b a c r r a a a a

For each letter, the previous letters 107' and text position 107' from the original source data block 105 is retained. The sorted text "bdbacrraaaa" can now be compressed by the compression transform data function 120 (FIG. 2).

With larger blocks and higher order (for text approximately 4 to 6) blocks appear like those with the full sorting of the BWT. For example the letters "sor" are often followed by the letter 't' on this page.

When using the BWT, it would be necessary to consider the contexts "dabra" and "aabra" to determine sort order of a(1) and c(5). In some cases (for example 1000 zero-bytes) the context can become very large before a sort order can be established. That drawback is avoided using preferred compression methods as described below.

FIGS. 5A–5B illustrate a method of unsorting the sorted text of FIG. 4B for decompression using internal contexts. After decoding, the sequence of decoded text 112' is known. It is also known that the letters preceding them were sorted in order, and this sequence 151 can be generated from the decoded text using a sorting or counting method similar to the inverse BWT, which returns the sequence "aaaaabbcdrr". These letters 151 are the predecessors of each of the letters in the decoded text 112'.

Because the processor sort sequence 151 is the context byte immediately prior to the sorted text item, they can be combined with the decoded text 112' to make pairs bf letters 152 known.

Each of these pairs of letters is also the context for one of the letters in the decoded text. These pairs 152 are then sorted by the last character first as was done in encoding, which yields a sort order 153 in the same order as the decoded text 107 (FIG. 4B). A sequential index 154 is then associated with the sorted pairs 153.

The order of the source data block can now be reconstructed as illustrated in FIG. 5B. As with the BWT, the position of the originally last (or first) character—index 11 in this case, which is associated with the context 'br' from the sorted pairs 153 and which itself is the context for an 'a' from the decoded text 112—is sorted. Alternatively, the context of the first character can be stored.

Either way one gets 'bra' as context for the first character. Now one searches the first context 'ra' (index 4) and gets another 'a' as next letter. Context 'aa'→b(1), context 'ab'→r (6), because the first appearing letter comes first in the sorted file in case of non-unique contexts, 'br'→a(10), 'ra'→c(5, since index 4 is already used), 'ac'→a(8), 'ca'→d(2), 'ad'→a(9), 'da'→b(3), and 'ab'→r(7). In this way the original text "abracadabra" 105' can be recovered completely.

In a practical implementation a pointer to the start of each context is stored in a hash-table. If this context appears, one follows the pointer and finds the correct continuation. Then the pointer is incremented by one.

For higher order, the order can be raised this way: the known n-letter combinations are extended by the letter following them, like here the known 1-letter contexts established by sorting or counting were extended to two-letter contexts. This results in knowledge of all n+1-letter combinations of the original text. This process can be repeated until the context size is large enough.

It is also possible to apply inverse BWT on the sorted text—all order+1 long letter combinations are returned correct and thus give all contexts of the original text. It could be that the inverse BWT returns to the origin early; if this is the case the inverse BWT must be restarted again with an unvisited index until all indices are visited.

Figure 6:
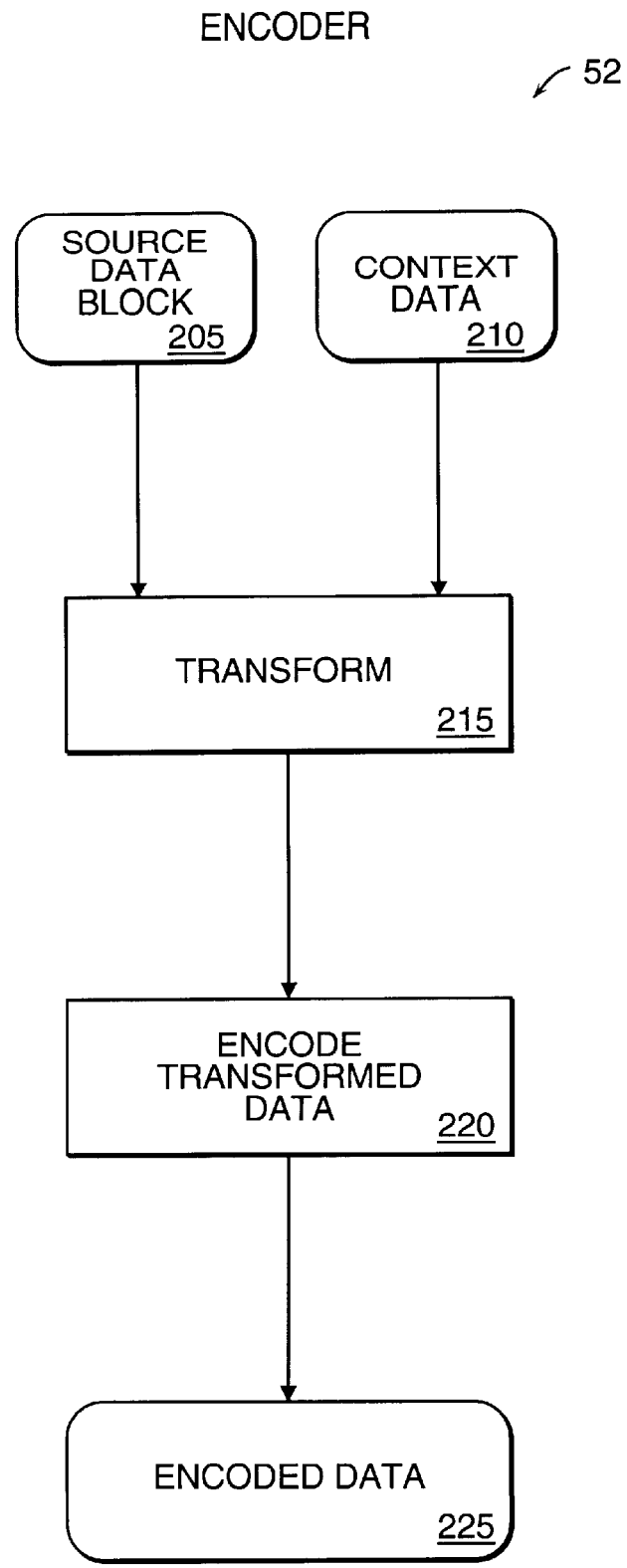
FIG. 6 is a block diagram of an encoder using external contexts in accordance with a preferred embodiment of the invention.

FIG. 6 is a block diagram of an encoder 52 using external contexts in accordance with a preferred embodiment of the invention. For each item in a source data block 205 to be encoded, a corresponding context 210 is provided. A transform 215 in accordance with the present invention is then implemented, and the transformed data block is then encoded into encoded data 225 by a compression transformed data function 220 using any suitable method.

Figure 7:
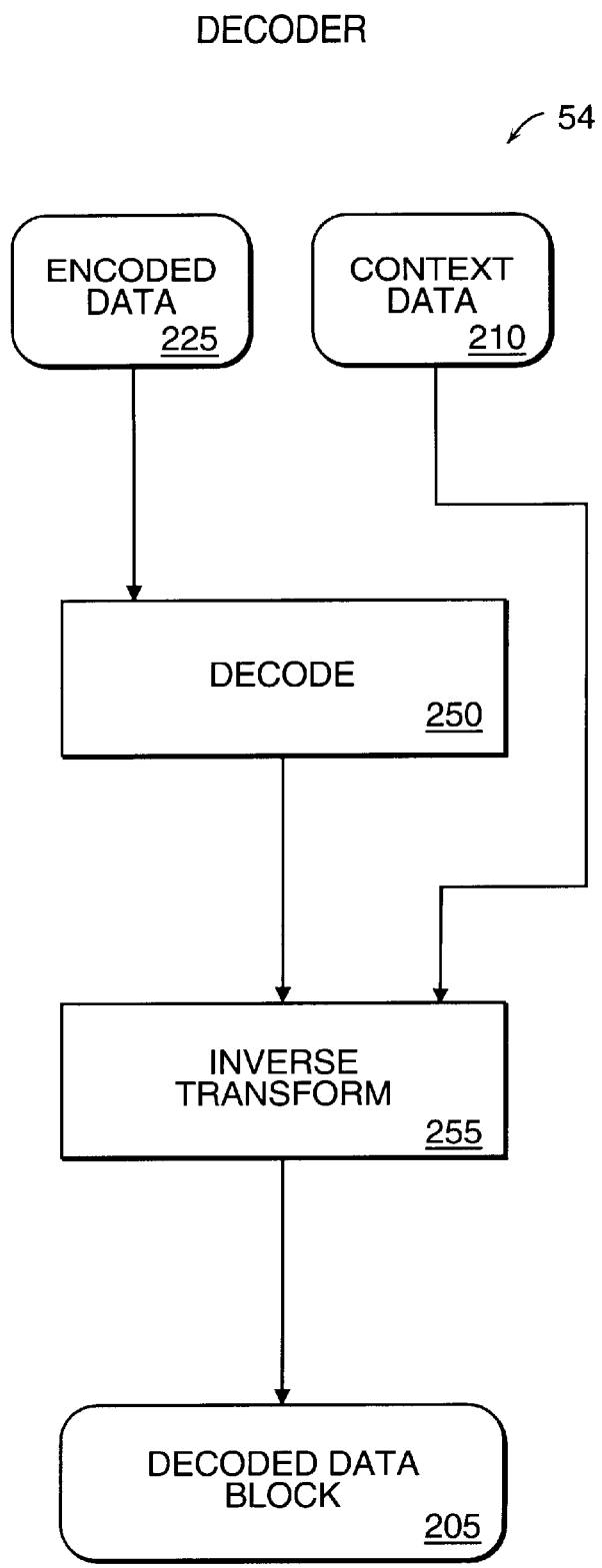
FIG. 7 is a block diagram of a decoder using external contexts in accordance with a preferred embodiment of the invention.

FIG. 7 is a block diagram of a decoder 54 using external contexts in accordance with a preferred embodiment of the invention. To restore the original data block 205, the encoded data 225 is first decoded by a decoder function 250 which uses the inverse of the algorithm that was used in the compression transform data function 225 (FIG. 6). In order to perform an inverse transform 255, the same context data 210 that was presented to the encoder 52 is supplied as input data. This enables the original data block to be restored by the inverse transform 255 as a decoded data block 205' identical to the original data block 205. Further details of a preferred embodiment of the invention using external contexts will be described in the following example.

FIGS. 8A–8D illustrate a method used in situations where the contexts for each data item to be coded are supplied as input data known to both the encoder and decoder. As in the above example, the method sorts the data items according to the contexts, and when contexts are equal, the position in the original data block is used as a secondary sort key. An example of this type of application is for coding image data using a binary pyramid.

As illustrated in FIG. 8A, each pixel 300 is assigned a label, here "A", "b", "c", "d", and "e". As illustrated in FIG. 8B, the image to be encoded is subdivided into little squares 305 (here edges are four pixels lengths long), and the corners are labeled with "A" and processed first. Then the centers of these little squares (labeled "b") are processed. As illustrated in FIG. 8C, the pixels labeled "A" and "b" together give smaller squares 310 rotated standing on a corner. The center points of these smaller squares (labeled "c") are next to be processed. As illustrated in FIG. 8D, the pixels labeled "A", "b" and "c" together form still smaller squares 315 with an edge size of two pixel lengths. The center points of those squares (labeled "d") come next. This is continued until all pixel are processed. The initial square size can be larger than the 4 pixels used in this example, and the processing would be the same except for the increase in the number of levels (f,g,h, . . . ) over the five (A . . . e) used here.

The encoding of the image can be done as five separate blocks. The first contains all of the "A"-labeled pixels, the second contains the "b"-labeled pixels, followed by the "c","d", and "e"-labeled pixels. When the "A"-labeled pixel block is encoded, no other context data is known, so the "A"-labeled pixels must be encoded using a method which does not require external contexts. The method illustrated by FIGS. 4A–4B could be used, or any other method. The method in accordance with a preferred embodiment of the invention is used for processing the "b"-labeled pixels and the subsequent levels.

Each "b"-labeled pixel has a context determined by the four "A"-labeled pixels at its corners. Because the "A"-labeled pixels were previously encoded, they will be known to the decoder when it decodes the "b"-labeled pixels. The "b"-labeled pixels are the source data block 205 (FIG. 6), and the contexts formed by the "A"-labeled pixels for each "b"-labeled pixel are the context data 210. If each context consists of four bytes, such as when four eight-bit "A"-labeled pixels are concatenated into a 32 bit word, the transform 215 is an order 4 sort, as shown in the second implementation below. Once transformed, the same encoding algorithm can be used for the encode transform data function 225 as was used above. After the "b"-labeled pixels have been encoded, the "A" and "b"-labeled pixels can be used as the contexts to transform the "c"-labeled pixels. This process is continued until all levels have been processed.

Many variations are possible. Instead of using the pixel values as the source data block 205, the data can include errors from predicted values. In this case, the contexts would not be directly formed by concatenating the raw "A"-labeled corner pixels, but rather would be consist of an error estimator synthesized from those "A"-labeled pixels. Such variations do not affect preferred methods of the present invention, as the sorting of the data according to the contexts would still be done in the same way.

This example demonstrates how the combination of a finite-context sort followed by a sort-by-position can be used as a solution to a wide range of applications in data compression to bring similar contexts together. Note that including a unique position in a sort key is equivalent to the method described herein—it just becomes part of the primary key instead of being a secondary key or handled implicit like in the following first implementation. This is true even if the so constructed key uses infinite context because any comparison will stop at the unique position.

Four sample implementations are set forth below. The first three implementations use an order 2 (two byte) context, which allows the counters used in the method to be handled using simple arrays and which then allows the use of the block position as a secondary sort key to be most easily understood. The first implementation describes an encoder that can be used for both internal and external contexts. The second implementation describes a decoder for external contexts. The third implementation describes a decoder for internal contexts. The fourth implementation describes an encoder using internal contexts which can handle higher orders and which uses the radix sort.

Preferred embodiments of the invention use counters to determine the frequency of each context and then to determine its position in the sorted data block. This is described with respect to the first, second and third implementations below. These preferred implementation provides three counter functions:

InitCounters—sets the counter values to zero

GetAndIncrement—retrieves and post-increments the counter value associated with a context AddCounters—replaces each counter value with a sum of previous counter values The first, second and third implementations implement these functions for order 2 (two byte context), which allows use of a simple array that provides a counters[i] value for each possible context i. At higher orders, an array representing all possible contexts may not be practical, and the simple array can be replaced by a trie, tree, hash-table, or other approach. Note that trees and tries can be walked in the order needed for AddCounters, whereas the contexts are additionally sorted for AddCounters if using a hash-table. A prototype pseudo-code fragment for implementing counters in accordance with a preferred embodiment of the invention for order 2 is as follows:

```
#define LARGESTCONTEXT 0xffff
int counters[LARGESTCONTEXT+1];
#define InitCounters        \
do{ int i;                  \
   for(i=0; i<=LARGESTCONTEXT; i++)\
      counters[i] = 0;      \
} while (0)
#define GetAndIncrement(context )  \
   counters[context]++
#define AddCounters \
do{ int i, sum=0;           \
   for(i=0; i<=LARGESTCONTEXT;i++)  \
   { sum += counters[i];    \
     counters[i] = sum - counters[i];\
   }                        \
} while (0)
```

Figure 9:
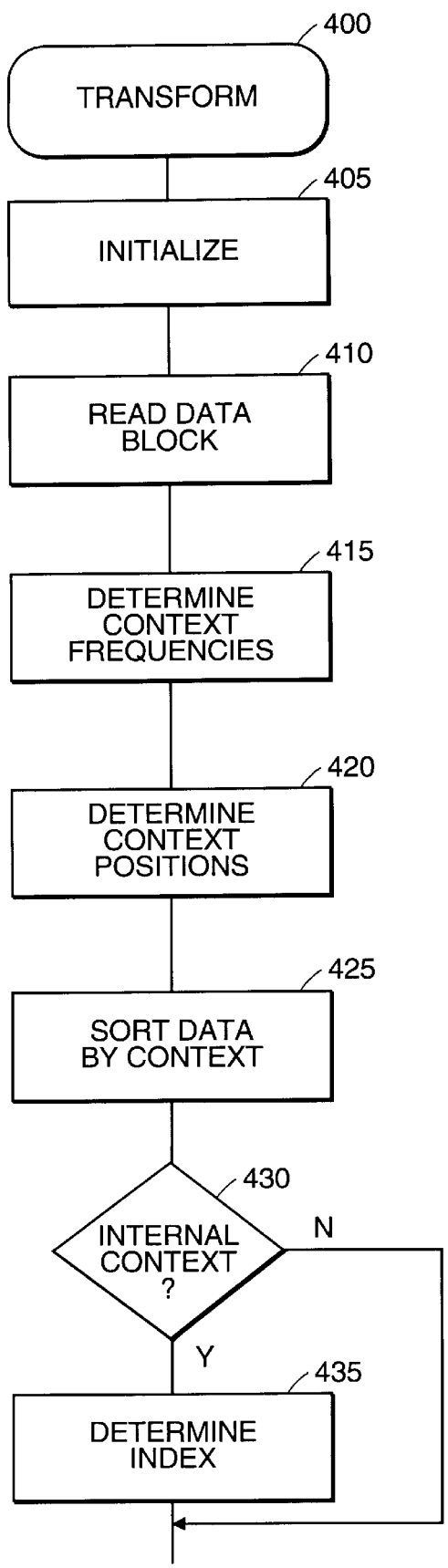
FIG. 9 is a flowchart of a preferred method for implementing a transform function.

FIG. 9 is a flowchart of a preferred method for implementing a transform function. The method 400 is used for the transform functions 110 (FIG. 2), 215 (FIG. 6) for internal and external contexts that are used in compression. Data variables are initialized at step 405. At step 410, the source data block is read. At step 415, the frequency of occurrence of each context in the data block is calculated. At step 420, the position of the first instance of each context in the data block is calculated. At step 425, the data from the data block is sorted by context.

At step 430, a check is made to determine whether internal contexts are being used. If so, then the index of the last element in the sorted data is stored at step 435.

A prototype pseudo-code fragment implementing the flowchart of FIG. 9 is given below. It is assumed that a function context(i) exists that gives the context of each symbol in the block to be processed. For internal contexts, this function returns the previous four bytes in the block. This example uses a bucketsort to show the relation to the decoder better. Items are sorted by the value of their context.

```
int i;
InitCounters;
for(i=0; i<BLOCKSIZE; i++)
   GetAndIncrement(context(i));
// The counters now contain the frequency that each context occurs
AddCounters;
// The counters now contain the position in the sorted data block
// where the first instance of each context occurs.
for(i=0; i<BLOCKSIZE; i++)
   output[GetAndIncrement(context(i))] = input[i];
// The array output now contains the sorted i[001b]nput array.
// Data is sorted by context. Where items have the same
// context, they are sorted in the order in which they occurred
// in the source data block
#ifdef INTERNAL_CONTEXT
   indexlast = GetAndIncrement(context(BLOCK SIZE-1)) -1;
#endif
// With internal contexts indexlast contains the index of
// the last element.
```

Figure 10:
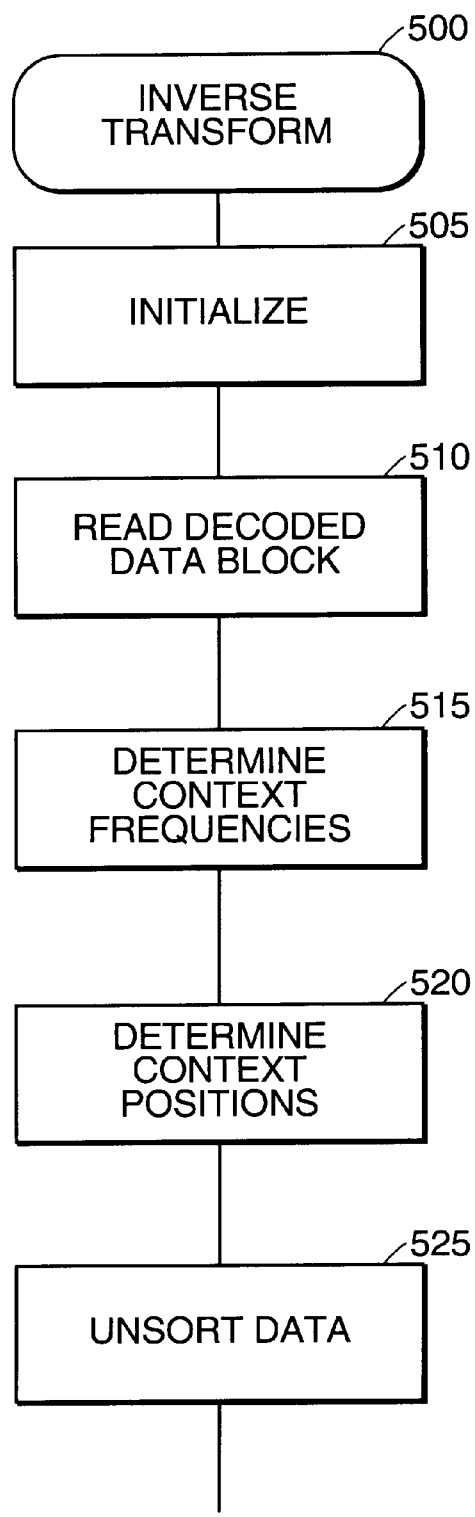
FIG. 10 is a flowchart of a preferred method of an inverse transform function.

FIG. 10 is a flowchart of a preferred method of an inverse transform function. The method 500 is applicable to the inverse transform 250 (FIG. 7) used for external contexts in decompression. At step 505, data variables are initialized. At step 510, the decompressed data block is read. At step 515, the frequency of occurrence of each context in the data block is calculated. At step 520, the position of the first instance of each context in the data block is calculated. At step 525, the data is unsorted.

A prototype pseudo-code fragment implementing the flowchart of FIG. 10 is given below. It is assumed that a function context(i) exists that gives the context of each symbol in the block to be processed. Note that with external contexts all contexts 210 (FIGS. 6–7) are already known, so this function is defined.

```
int i;
InitCounters;
for(i=0; i<BLOCKSIZE; i++)
   GetAndIncrement(context(i));
AddCounters;
for(i=0; i<BLOCKSIZE; i++)
   output[i] = input[GetAndIncrement(context(i))];
// The array output now contains the unsorted input array.
```

Figure 11:
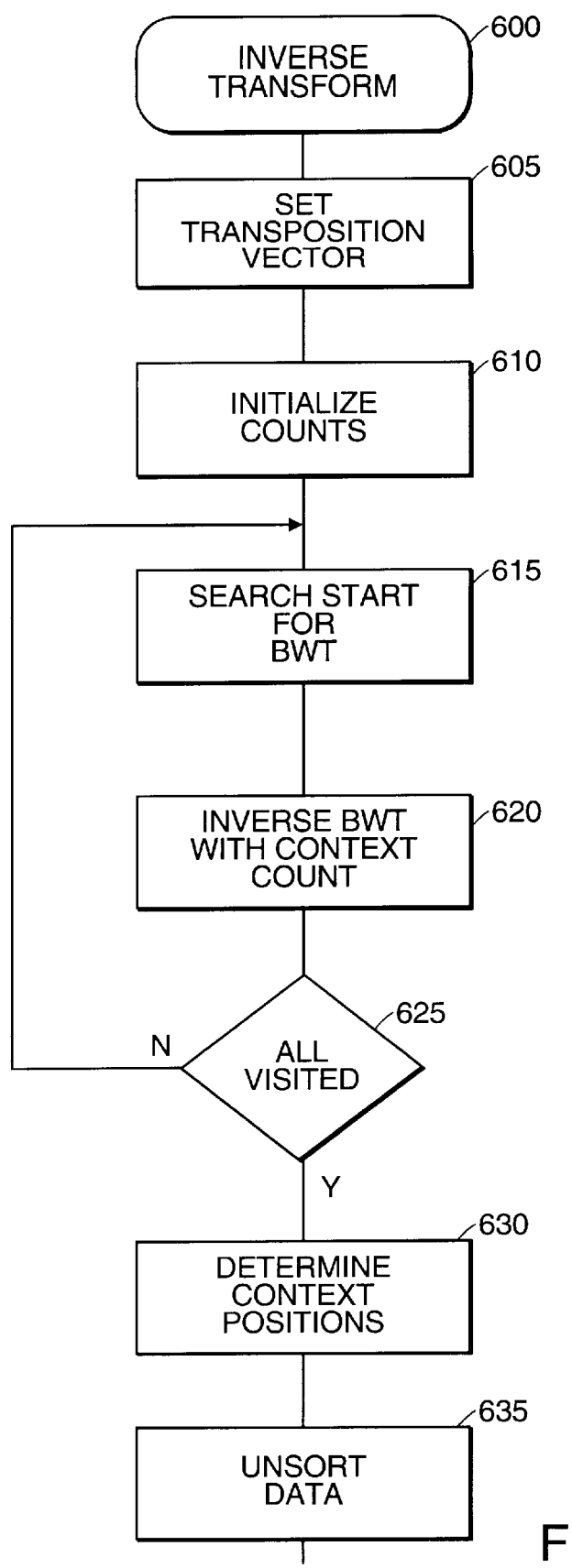
FIG. 11 is a flowchart of a preferred method of another inverse transform function.

FIG. 11 is a flowchart of a preferred method of another inverse transform function. The method 600 is applicable to the inverse transform 155 (FIG. 3) for internal contexts used in decompression.

Unlike the inverse transfer method 500 of FIG. 10, more effort is needed here to determine context frequencies. The initialization step 505 (FIG. 10) is extended by construction of a transposition vector at step 605. At step 610, counts are initialized. The counting step 515 (FIG. 10) is replaced by a more complex sequence of steps (steps 615–625) which use repeated inverse BWT attempts. At step 630, context positions are determined as above in FIG. 10 (step 520). At step 635, the data is unsorted. A prototype pseudo-code fragment for implementing the method of FIG. 11 is as follows:

```
// First do a modified Burrows-Wheeler backtransform to count contexts.
// It is assumed that a function exists that adds one character to a
// known context to give the context for the next character.
# define ORDER 2
# define UpdateContext(context,symbol)  \
do{ (context) = (context)>>8 | (symbol)<<8;  \
   } while (0)
int j, transvec[BLOCKSIZE+1], charcount[256], ctext, start, initctext;
   for (j=0;<256;j++)
      charcount[j] = 0;
   for (j=0; j<bufsize; j++)
      charcount[inbuffer[j]]++;
   for (j=1; j<256; j++)
      charcount[j] += charcount[j-1];
j=BLOCK SIZE;
do {
   j--;
   transvec[--(charcount[inbuffer[j]])] = j;
} while (j>0);
transvec[BLOCKSIZE] = 0; /* make sure this is not 0xffffffff */
// Now transvec contains a transposition vector and one extra element
   InitCounters;
   for (start=0; start<BLOCKSIZE;) {
      j = start;
      ctext = 0;
      for(i=0; i<ORDER-1; i++) {
         UpdateContext(ctext,inbuffer[j]);
         j = transvec[j];
      }
      while (transvec[j] != 0xffffffff) {
         int tmp=j;
         UpdateContext(ctext,inbuffer[tmp]);
         GetAndIncrement(ctext);
         if(tmp == indexlast)
```

-continued

```
    initctext = ctext;
    j = transvec[tmp];
    transvec[tmp] = 0xffffffff;
    }
while (transvec[start] == 0xffffffff)
    start++;
}
// All contexts of the original text appeared exactly in the inverse BWT.
// Therefore the counters are correct.
    AddCounters;
    ctext = initctext;
for(i=0; i<BLOCKSIZE; i++) {
    output[i] = input[GetAndIncrement(ctext)];
    UpdateContext(ctext,output[i]);
    }
// the array output now contains the unsorted input array.
```

Figure 12:
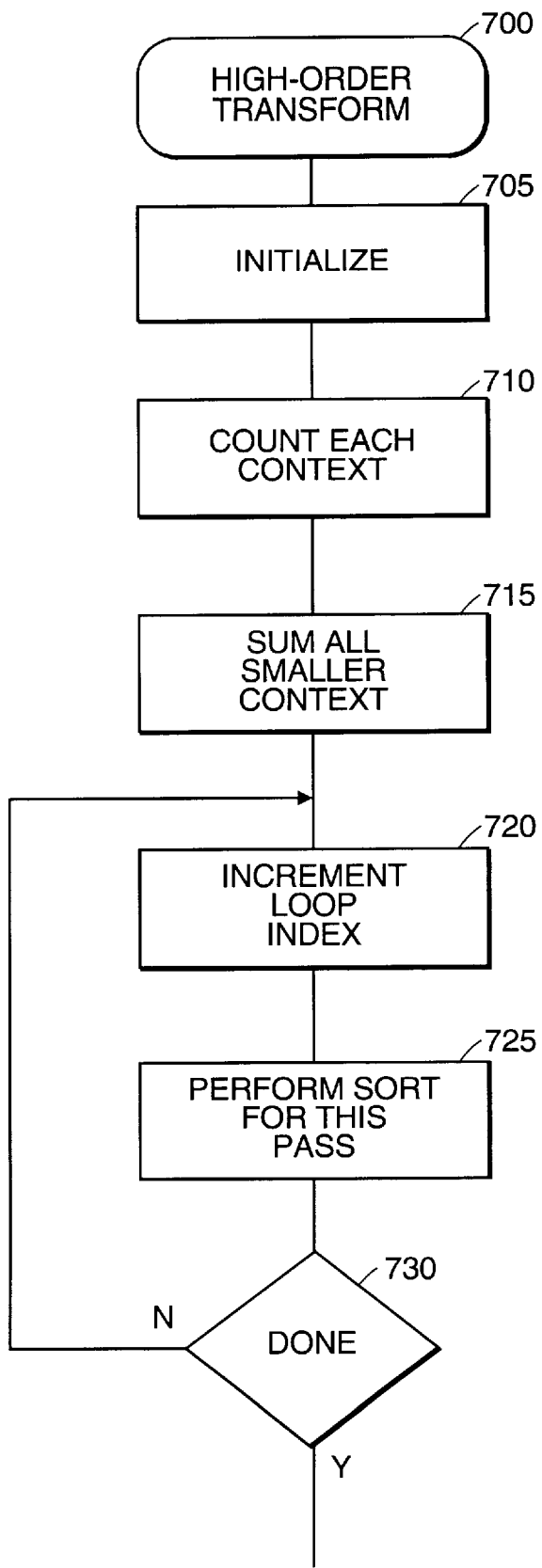
FIG. 12 is a flowchart of a high-order method for a transform function.

FIG. 12 is a flowchart of a high-order method for a transform function. The method 700 can be applied as a higher order transform 110 (FIG. 2) for internal contexts. A particular preferred implementation of the transform supports 6 byte contexts and uses the radix sort to achieve fast encoding speeds. It sorts the data in three passes, using two bytes of the context in each pass.

At step 705, data variables are initialized as above. At step 710, each context is counted as above. At step 715, all smaller contexts are summed independent of the system end as above.

At step 720, a loop begins to process multiple passes of sorting. A loop index is incremented at step 720. At step 725, the sort is performed for the current pass. At step 730, the loop can return to step 720 for another pass or processing can exit.

Preferred embodiments of the invention can be implemented in hardware easily, by replacing variable with storage, loops with counters and indices with memory readouts where the index is sent to the address connectors. There are optimizations which can be exploited by hardware implementations. For example it may make sense to collect some bytes in fast static ram and then transmit them as a block to slow dynamic ram. It is also possible to introduce pipelining easily; one block is postprocessed, some others are in different sorting stages or are preprocessed/counted. Because any intermediate stage is possible (CPU+ROM program—hardware or software) all such combinations are understood to be within the scope of the invention. A prototype pseudo-code fragment is as follows:

```
#include <string.h>
#define ORDER 6
#define MAXBLOCKIZE 1000000
#define BOUNTSIZE 0x10000L
#define U2(x) (*((unsigned short *0(x)))
char inbuffer[MAXBLOCKSIZE+ORDER], outbuffer[MAXBLOCKSIZE];/* a
*/
unsigned long block size, counters[COUNTSIZE], countersback[COUNTSIZE],
                b1[MAXBLOCKSIZE], *src, i,j, sum;
#if ORDER > 4
unsigned long b2[MAXBLOCKSIZE], *dest, *swap;
#endif
union {unsigned short u2; char c[2];} i_u;
. . .
src = b1;
#if ORDER > 4
dest = b2;
#endif
. . .
        bzero(counters, COUNTSIZE*sizeof(unsigned long));    /* b */
        bcopy(inbuffer, inbuffer+block size, ORDER);
        for (i=0; i<blocksize; i++ ) /* c */
                counters[U2(inbuffer+i)]++;
        sum = 0;             /* d */
        for (i=0; i<256; i++) {
                i_u.c[0] = (unsigned char)i;
                for (j=0; j<256; j++) {
                        i_u.c[1] = (unsigned char)j;
                        sum += counters[i_u.u2];
                        counters[i_u.u2] = sum - counters[i_u.u2];
                }
        }
        bcopy( counters, countersback, COUNTSIZE*sizeof(unsigned long));
        for (i=block size; i>0; ) {    /* e */
                I--;
                src[counters[U2(inbuffer+i+ORDER-1)]++] = i;
        }
#if ORDER > 4    /* f */
        for ( j = ORDER-4; j>0; j-= 2) {
                bcopy( countersback, counters, COUNTSIZE*sizeof(unsigned
long));
                for ( i=block size; i>0; ) {
                I--;
                dest[counters[U2(inbuffer+src[i]+j+1)]++] = src[i];
        }
        swap = src;
        src = dest;
```

-continued

```
        dest = swap;
    }
#endif
    for (i=block size; i>0; ) {    /* g */
        I--;
        outbuffer[countersback[U2(inbuffer+src[i]+1)]++] =
inbuffer[src[i]];
    }
```

Equivalents

While the invention has been particularly shown and described with reference to preferred embodiments thereof, it will be understood to those skilled in the art that various changes in form and detail can be made without departing from the spirit and scope of the invention as defined by the appended claims. For example, although the invention has been described with reference to particular hardware and software embodiments, it will be understood that various aspects of the invention can be embodied in either hardware, software or firmware.

These and all other equivalents are intended to be encompassed by the following claims.

The invention claimed is:

1. A method of compressing a source data block having a plurality of data values, whereby each data value within the source data block has a context, the method comprising:

using the context to define a primary sort key of a fixed, predetermined length for each data value;

deriving a secondary sort key for each data value from the position of the data value within the source data block;

generating a sorted source data block, comprising:

sorting the data values according to the primary sort key; and for data values whose primary sort key is the same, further sorting the data values according to the secondary sort key; and compressing the sorted source data block into a compressed data block.

2. The method of claim 1 wherein the secondary sort key is used implicitly.

3. The method of claim 1 wherein sorting comprises employing a radix sort.

4. The method of claim 1 wherein the source data block is restorable from the compressed data block.

5. The method of claim 4 wherein the source data block is restorable by calculating a transposition vector.

6. The method of claim 5 wherein the transposition vector is derived from a Burrows-Wheeler Transform.

7. The method of claim 1 further comprising deriving the context from the source data block.

8. The method of claim 1 further comprising determining the context independently from the source data block.

9. An apparatus for and compressing a source data block having a plurality of data values, whereby each data value within the source data block has context, comprising:

a primary sort key of a fixed, predetermined length for each data value defined by the context;

a secondary sort key for each data value derived from the position of the data value within the source data block;

a sorter for creating a sorted source data block, the sorter comprising:

a primary sorter for sorting the data values according to the primary sort key;

for data values having identical primary sort keys, a secondary sorter for sorting the data values according to the secondary sort key; and compressing the sorted source data block into a compressed data block.

10. The apparatus of claim 9 wherein the secondary sort key is used implicitly.

11. The apparatus of claim 9 wherein the sorter employs a radix sort algorithm.

12. The apparatus of claim 9 wherein the source data block is restorable from the compressed data block.

13. The apparatus of claim 12 wherein the source data block is restorable from a transposition vector.

14. The apparatus of claim 13 wherein the transposition vector is derived from a Burrows-Wheeler Transform.

15. The apparatus of claim 9 wherein the context is derived from the source data block.

16. The apparatus of claim 9 wherein the context is determined independently from the source data block.

17. An article of manufacture comprising:

a machine-readable medium;

a method stored in the machine-readable medium to compress a block of data, the method comprising:

using the context to define a primary sort key of a fixed, predetermined length for each data value;

deriving a secondary sort key for each data value from the position of the data value within the source data block;

generating a sorted source data block, comprising:

sorting the data values according to the primary sort key; and for data values whose primary sort key is the same, sorting the data values according to the secondary sort key; and compressing the sorted source data block into a compressed data block.

18. The article of claim 17 wherein the secondary sort key is used implicitly.

19. The article of claim 17 wherein the sorting comprises employing a radix sort.

20. The article of claim 17 wherein the source data block is restorable from the comprised data block.

21. The article of claim 20 wherein the source data block is restorable by calculating a transposition vector.

22. The article of claim 21 wherein the transposition vector is derived from a Burrows-Wheeler Transform.

23. The article of claim 17 wherein the method further comprises deriving the context from the source data block.

24. The article of claim 17 wherein the method further comprises determining the context independently from the source data block.

* * * * *